(12) United States Patent
Chen et al.

(10) Patent No.: US 6,524,962 B2
(45) Date of Patent: Feb. 25, 2003

(54) METHOD FOR FORMING DUAL-DAMASCENE INTERCONNECT STRUCTURE

(75) Inventors: Hsueh-Chung Chen, Yung-Ho (TW); Teng-Chun Tsai, Hsin-Chu (TW); Yi-Min Huang, Ching-Shui Chen (TW)

(73) Assignee: United Microelectronics Corp.

( * ) Notice: Subject to any disclaimer, the term of this patent is extended or adjusted under 35 U.S.C. 154(b) by 0 days.

(21) Appl. No.: 09/870,527

(22) Filed: May 31, 2001

(65) Prior Publication Data

US 2002/0182869 A1 Dec. 5, 2002

(51) Int. Cl.[7] .............................................. H01L 21/311
(52) U.S. Cl. ...................................... 438/694; 438/725
(58) Field of Search ................................ 438/706, 710, 438/711, 712, 725, 690, 691, 692, 693, 694

(56) References Cited

U.S. PATENT DOCUMENTS

| | | | | |
|---|---|---|---|---|
| 6,114,233 A | * | 9/2000 | Yeh | 438/622 |
| 6,255,735 B1 | * | 7/2001 | Wang et al. | 257/642 |
| 6,265,780 B1 | * | 7/2001 | Yew et al. | 257/642 |
| 6,319,814 B1 | * | 11/2001 | Tsai et al. | 438/622 |
| 6,355,555 B1 | * | 3/2002 | Park | 257/760 |
| 6,380,091 B1 | * | 4/2002 | Wang et al. | 438/706 |

* cited by examiner

*Primary Examiner*—Benjamin L. Utech
*Assistant Examiner*—Kin-Chan Chen
(74) *Attorney, Agent, or Firm*—Powell Goldstein Frazer & Murphy LLP

(57) ABSTRACT

The present invention provides a method for forming a dual-damascene structure and comprises following steps. First, a substrate is provided. Then, a first low-k dielectric layer and a second low-k dielectric layer are sequentially formed on the substrate. Next, a first via hole is formed in the first low-k dielectric layer by removing a portion of the second low-k dielectric layer and the first low-k dielectric layer. Thereafter a second via hole is formed in the second low-k dielectric layer by removing a portion of the second low-k dielectric layer, wherein the second via hole connects with the first via hole. Then, a conductive layer is formed to fill the first via hole and the second via hole. Next, the second low-k dielectric layer is removed. Last, a low-k dielectric layer is formed on the first low-k dielectric layer and exposes the conductive layer.

19 Claims, 3 Drawing Sheets

METHOD FOR FORMING DUAL-DAMASCENE INTERCONNECT STRUCTURE

BACKGROUND OF THE INVENTION

1. Field of the Invention

The present invention generally relates to a method for forming a dual-damascene structure, and more particularly relates to a method for forming a Cu/low-k dual-damascene structure.

2. Description of the Prior Art

In very and ultra large scale integration (VLSI and ULSI) circuits, an insulating or dielectric material, such as silicon oxide, of the semiconductor device in the dual damascene process is patterned with several thousand openings for the conductive lines and vias which are filled with metal, such as aluminum, and serve to interconnect the active and/or passive elements of the integrated circuit. The dual damascene process also is used for forming the multilevel signal lines of metal, such as copper, in the insulating layers, such as polyimide, of multilayer substrate on which semiconductor devices are mounted.

Damascene is an interconnection fabrication process in which grooves are formed in an insulating layer and filled with metal to form the conductive lines. Dual damascene is a multi-level interconnection process in which, in addition to forming the grooves of single damascene, the conductive via openings also are formed. In the standard dual damascene process, the insulating layer is coated with a resist material which is exposed to a first mask with the image pattern of the via openings and the pattern is anisotropic etched in the upper half of the insulating layer. After removal of the patterned resist material, the insulating layer is coated with a resist material which is exposed to a second mask with the image pattern of the conductive lines in alignment with the via openings. In anisotropically etching the openings for the conductive lines in the upper half of the insulating material, the via openings already present in the upper half are simultaneously etched in the lower half of the insulating material. After the etching is complete, both the vias and grooves are filled with metal. Dual damascene is an improvement over single damascene because it permits the filling of both the conductive grooves and vias with metal at the same time, thereby eliminating process steps.

As the dimensions of integrated circuits continues to shrink, Cu/low-k (k<3.0) integration scheme is the key point of reducing the RC delay and achieving the high performance interconnection. Copper can effectively reduce the electrical resistance of the conducting lines, and low-k dielectrics can decrease the capacitance between intra-metal lines. Spin-on-dielectrics (SOD) is the most potential process for the mass-production applications. They consist of aromatic thermosets polymers, and so on. The carbon contains a porous structure which will reduce the dielectric constant of the dielectrics. Usually, the mechanical strength of low-k dielectrics is much less than the conventional silicon dioxide as the increasing of carbon contains and porous ratio. Therefore, there are many challenges for Cu/low-k integration, especially for those ultra-low-k materials (k<2.5) having poor mechanical properties. How to form the dual-damascene structure is still a challenge for integrated circuits.

SUMMARY OF THE INVENTION

An object of the invention is to provide a method for forming a dual-damascene structure.

Another object of the invention is to provide a method for forming a dual-damascene structure in a Cu/low-k process.

In order to achieve the previous objects of the invention, the present method comprises the following steps. First, a substrate is provided. Then, a first low-k dielectric layer and a second low-k dielectric layer are sequentially formed on the substrate. Next, a first via hole is formed in the first low-k dielectric layer by removing a portion of the second low-k dielectric layer and the first low-k dielectric layer. Thereafter, a second via hole is formed in the second low-k dielectric layer by removing a portion of the second low-k dielectric layer, wherein the second via hole connects with the first via hole. Then, a conductive layer is formed to fill the first via hole and the second via hole. Next, the second low-k dielectric layer is removed. Last, a low-k dielectric layer is formed on the first low-k dielectric layer and exposes the conductive layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated from silicon semiconductor materials, but will include those devices fabricated in one or more of the available semiconductor materials.

Further, although the embodiments illustrated herein are shown in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

In this invention, a set of new process steps was introduced to form a Cu/low-k dual-damascene structure. The method comprises the following steps and will be explained in detail below, as shown in FIGS. 1 to 5.

Figure 1:
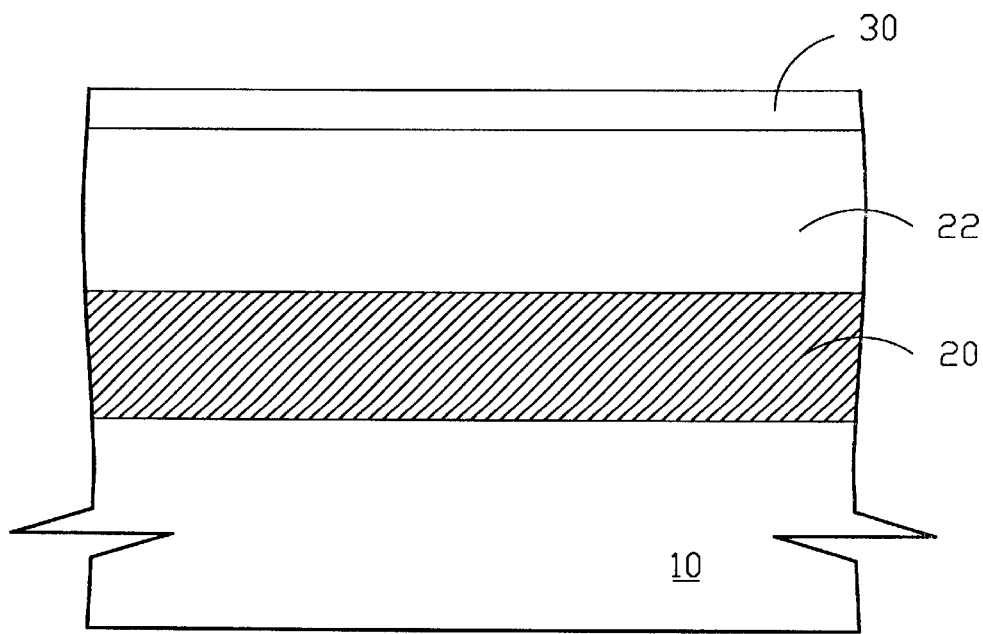
FIG. 1 is the schematic representation of the structure after forming a first low-k dielectric layer, a second low-k dielectric layer, and a hard-mask layer in a substrate, in accordance with the present invention.

Referring to FIG. 1, first, a substrate 10 is provided. Then, a first low-k dielectric layer 20 and a second low-k dielectric layer are sequentially formed on the substrate 10. The first low-k dielectric layer 20 is in a thickness of between about 1500 to 4000 angstroms and is made of dielectric, such as oxide or FSG. The second low-k dielectric layer 22 is in a thickness of between about 1500 to 20000 angstroms and is made of dielectric, such as silicon nitride or silicon carbide. The second low-k dielectric layer 22 has a different etching selectivity from the first low-k dielectric layer 20. There may be an adhesion promoter or a stop layer between the first low-k dielectric layer 20 and the second low-k dielectric layer 22. Next, a hard-masking layer 30 is formed to cap the second low-k dielectric layer 22. The hard-mask layer is in a thickness of between about 100 to 2000 angstroms.

Figure 2:
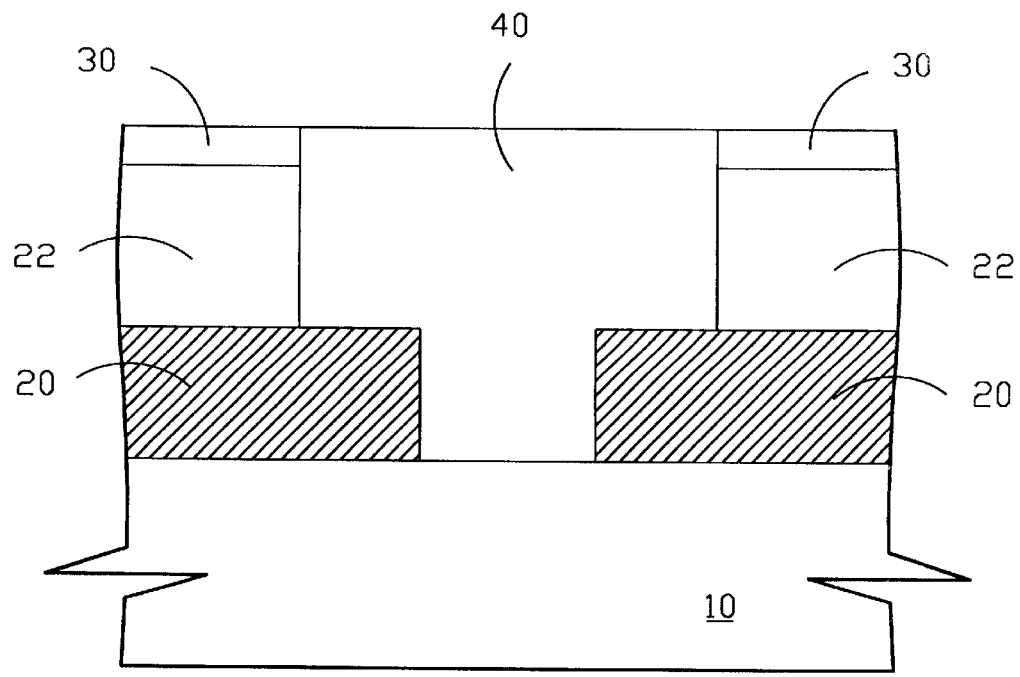
FIG. 2 is the structure of FIG. 1 after forming a dual-damascene structure and filling a conductive material therein, in accordance with the present invention.

Referring to FIG. 2, after lithography processes, a dual-damascene structure is formed in the first low-k dielectric layer 20 and the second low-k dielectric layer 22. The dual-damascene structure comprises a first via hole in the first low-k dielectric layer 20 and a second via hole in the second low-k dielectric layer 22. The second via hole connects with the first via hole of the dual-damascene structure, which exposes the substrate 10. The second via hole is formed for a conductive line. The first low-k dielectric layer 20 is used to be a via-level dielectric and is thinner than the second dielectric layer 22. Then, a conductive layer 40 is conformally deposited on the hard-mask layer 30 and the dual-damascene structure to fill the dual-damascene structure. The conductive layer 40 is made of a metal, such as copper. Next, a chemical mechanical polishing process is performed to remove the excess conductive layer 40 which is out of the dual-damascene structure. The chemical mechanical polishing process is stopped on the hard-mask layer 30. There may further steps for forming a metal liner layer, as not shown in figures, before for forming the conductive layer 40. The metal liner layer is conformally formed on the hard-mask layer and on a sidewall and a bottom surface of the dual-damascene structure. The metal liner layer can be made of tantalum/tantalum nitride or titanium/titanium nitride. The metal liner layer on the hard-mask layer 30 will be also removed in the chemical mechanical polishing process.

Figure 3:
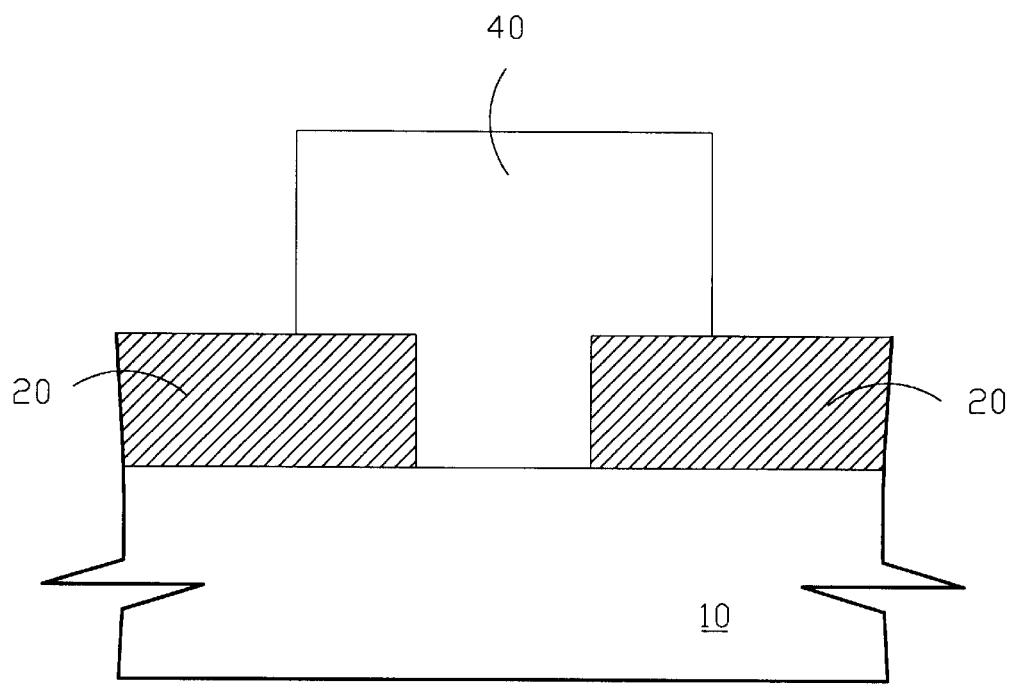
FIG. 3 is the structure of FIG. 2 after removing the hard-mask layer and the second low-k dielectric layer, in accordance with the present invention.

Referring to FIG. 3, after removing the hard-mask layer 30, the second low-k dielectric layer 22 is removed. Because the second low-k dielectric layer 22 has different etching selectivity compared with the first low-k dielectric layer 20, the second low-k dielectric layer 22 can be easily removed using a wet or dry etching process. The hard-mask layer 30 and the second low-k dielectric layer 22 can be removed at the same time depending on its property. The second low-k dielectric layer 22 is used as a mold for low-k material.

Figure 4:
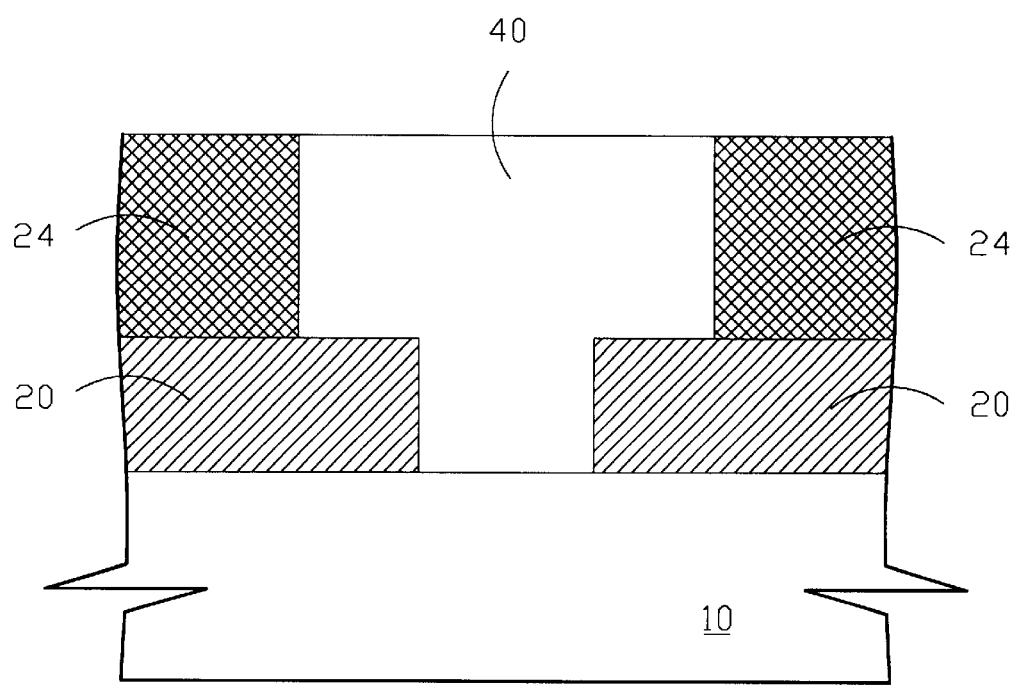
FIG. 4 is the structure of FIG. 3 after refilling a low-k dielectric layer layer, in accordance with the present invention.

Referring to FIG. 4, thereafter a low-k dielectric layer 24, especially having a dielectric constant below 2.5, is refilled on the first low-k dielectric layer 20. Then, a planarization process is performed to remove excess low-k dielectric layer 24 and the conductive material 40 is exposed. The first low-k dielectric layer 20 is used as a strong basis for the low-k dielectric layer 24, which has poor mechanical strength. Furthermore, the thickness of the first low-k dielectric layer 20 is much smaller than a thickness of the low-k dielectric layer 24, so it does not advance too much the dielectric constant for the whole dielectric layers.

Figure 5:
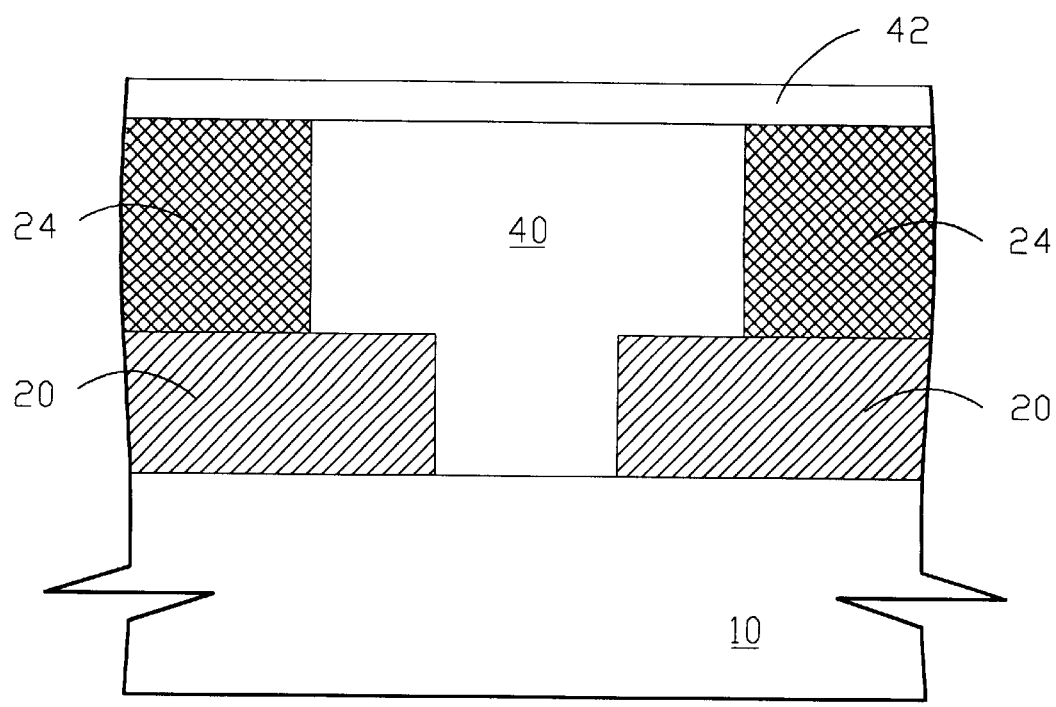
FIG. 5 is the structure of FIG. 4 after forming a cap layer on the low-k dielectric layer and the conductive material, in accordance with the present invention.

Referring to FIG. 5, lastly, a cap layer 42 is formed on a surface of the low-k dielectric layer 24 and the conductive layer 40. The cap layer 42 has a thickness of between about 200 to 1000 angstroms and is made of silicon nitride, silicon carbide, tantalum, or tantalum nitride.

To sum up the foregoing, this invention provides a method for forming a Cu/low-k dual-damascene structure. First, the present method uses first and second low-k dielectric materials to form a dual-damascene structure. The first low-k dielectric material (such as oxide, FSG, and so on) is formed to be a via-level dielectric. The second low-k dielectric material has a different etching selectivity from the first low-k dielectric material and is used as a mold to complete the dual-damascene structure. Then, the second low-k dielectric material is removed by using a dry or,a wet etching process. Lastly, the ultra-low-k dielectric material (k<2.5) is filled in the dual-damascene structure. The first low-k dielectric material can be a strong basis for the ultra-low-k dielectric material.

Of course, it is to be understood that the invention need not be limited to these disclosed embodiments. Various modifications and similar changes are still possible within the spirit of this invention. In this way, the scope of this invention should be defined by the appended claims.

What is claimed is:

1. A method for forming a dual-damascene structure, said method comprising:

providing a substrate;

forming a first dielectric layer on said substrate, wherein the thickness of said first dielectric layer is about 500 angstrom to 4000 angstrom;

forming a second dielectric layer on said first dielectric layer, wherein the thickness of said second dielectric layer is about 1500 angstrom to 20000 angstrom;

removing a portion of said second dielectric layer and said first dielectric layer to form a first via hole in said first dielectric layer;

removing a portion of said second dielectric layer to form a second via hole in said second dielectric layer, wherein said second via hole connects with said first via hole;

forming a conductive layer to fill said first via hole and said second via hole;

removing said second dielectric layer; and forming a low-k dielectric layer on said first dielectric layer which is exposing said conductive layer.

2. The method according to claim 1, wherein an etching selectivity of said second dielectric layer is different to an etching selectivity of said first dielectric layer.

3. The method according to claim 1, wherein said first dielectric layer is selected from the group consisting of oxide and FSG.

4. The method according to claim 1, wherein said second dielectric layer is selected from the group consisting of silicon nitride and silicon carbide.

5. The method according to claim 1, further comprising a step of forming a hard-mask layer on said second dielectric layer after forming said second dielectric layer.

6. The method according to claim 1, further comprising a step of forming a metal liner layer on a sidewall and a bottom surface of said first via hole and said second via hole before forming said conductive layer.

7. The method according to claim 1, wherein said conductive layer is made of copper.

8. The method according to claim 1, further comprising a chemical mechanical polishing process to remove excess said conductive layer after forming said conductive layer.

9. The method according to claim 1, wherein removing said second dielectric layer is using an etching process.

10. The method according to claim 1, wherein said low-k dielectric layer has a dielectric constant below 2.5.

11. The method according to claim 1, wherein said low-k dielectric layer is formed by using a depositing process.

12. The method according to claim 11, further comprising a planarization process after depositing said low-k dielectric layer.

13. The method according to claim 1, further comprising a step of forming a cap layer on a surface of said low-k dielectric layer and said conductive layer.

14. A method for forming a dual-damascene structure, said method comprising:

providing a substrate;

forming a first dielectric layer on said substrate;

forming a second dielectric layer on said first dielectric layer, wherein an etching selectivity of said second dielectric layer is different to an etching selectivity of said first dielectric layer;

forming a hard-mask layer on said second dielectric layer;

removing a portion of said hard-mask layer, said second dielectric layer, and said first dielectric layer to form a first via hole in said first dielectric layer;

removing a potion of said hard-mask layer and said second dielectric layer to form a second via hole in said second dielectric layer, wherein said second via hole connects with said first via hole;

forming a copper layer to fill said first via hole and said second via hole;

using a chemical mechanical polishing process to remove excess said copper layer and stop on said hard-mask layer;

removing said hard-mask layer;

using an etching process to remove said second dielectric layer;

forming a low-k dielectric layer on said first dielectric layer which is exposing said copper layer, wherein said low-k dielectric layer has a dielectric constant below 2.5; and forming a cap layer on a surface of said low-k dielectric layer and said copper layer.

15. The method according to claim 14, wherein said first dielectric layer is selected from the group consisting of oxide and FSG.

16. The method according to claim 15, further comprising a planarization process after depositing said low-k dielectric layer.

17. The method according to claim 14, wherein said second dielectric layer is selected from the group consisting of silicon nitride and silicon carbide.

18. The method according to claim 14, further comprising a step of forming a metal liner layer on a sidewall and a bottom surface of said first via hole and said second via hole before forming said copper layer.

19. The method according to claim 14, wherein said low-k dielectric layer is formed by using a depositing process.

* * * * *